United States Patent
Lin et al.

(10) Patent No.: US 8,124,490 B2
(45) Date of Patent: Feb. 28, 2012

(54) SEMICONDUCTOR DEVICE AND METHOD OF FORMING PASSIVE DEVICES

(75) Inventors: Yaojian Lin, Singapore (SG); Haijing Cao, Singapore (SG); Qing Zhang, Singapore (SG); Robert C. Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 271 days.

(21) Appl. No.: 11/958,546

(22) Filed: Dec. 18, 2007

(65) Prior Publication Data

US 2008/0153245 A1    Jun. 26, 2008

Related U.S. Application Data

(60) Provisional application No. 60/871,416, filed on Dec. 21, 2006.

(51) Int. Cl.
    *H01L 21/20*    (2006.01)
(52) U.S. Cl. .................. 438/393; 438/728; 257/E21.02; 257/E27.048; 257/E29.343
(58) Field of Classification Search .................. 438/108, 438/238, 239, 381, 393, 396, 250, 253, 738; 257/E21.01, E21.008, E21.021, E21.022, 257/535, E27.048, E27.024, E27.044, E27.071, 257/E29.342, E29.343, E25.015, E25.025, 257/E21.017, E21.02
See application file for complete search history.

(56) References Cited

U.S. PATENT DOCUMENTS

| | | | | |
|---|---|---|---|---|
| 4,963,741 A | * | 10/1990 | McMullin | 250/338.3 |
| 6,027,980 A | * | 2/2000 | Gardner | 438/396 |
| 6,448,708 B1 | * | 9/2002 | Chakravorty et al. | 313/495 |
| 6,452,270 B1 | * | 9/2002 | Huang | 257/738 |
| 6,492,222 B1 | * | 12/2002 | Xing | 438/240 |
| 6,500,724 B1 | * | 12/2002 | Zurcher et al. | 438/384 |
| 6,919,244 B1 | * | 7/2005 | Remmel et al. | 438/239 |
| 7,214,990 B1 | * | 5/2007 | Lee et al. | 257/369 |
| 7,259,077 B2 | | 8/2007 | Degani et al. | |
| 7,368,311 B2 | * | 5/2008 | Tilmans et al. | 438/48 |
| 7,473,951 B2 | * | 1/2009 | Kim et al. | 257/296 |
| 7,535,079 B2 | * | 5/2009 | Remmel et al. | 257/532 |
| 7,579,694 B2 | * | 8/2009 | Jan et al. | 257/778 |
| 7,645,619 B2 | * | 1/2010 | Oh et al. | 438/3 |
| 2001/0054728 A1 | * | 12/2001 | Paz de Araujo et al. | 257/296 |
| 2002/0164862 A1 | * | 11/2002 | Lepert et al. | 438/393 |
| 2003/0067053 A1 | * | 4/2003 | Hori et al. | 257/532 |
| 2003/0080476 A1 | * | 5/2003 | Barton et al. | 264/603 |
| 2004/0104420 A1 | * | 6/2004 | Coolbaugh et al. | 257/310 |
| 2004/0155278 A1 | * | 8/2004 | Natori et al. | 257/306 |
| 2004/0191981 A1 | * | 9/2004 | Yates et al. | 438/238 |
| 2005/0017355 A1 | * | 1/2005 | Chou et al. | 257/738 |
| 2005/0218520 A1 | * | 10/2005 | Kikuta et al. | 257/758 |

(Continued)

*Primary Examiner* — Matthew Landau
*Assistant Examiner* — Joseph C Nicely
(74) *Attorney, Agent, or Firm* — Robert D. Atkins; Patent Law Group: Atkins & Associates, P.C.

(57) ABSTRACT

A flip chip semiconductor device has a substrate with a plurality of active devices formed thereon. A passive device is formed on the substrate by depositing a first conductive layer over the substrate, depositing an insulating layer over the first conductive layer, and depositing a second conductive layer over the insulating layer. The passive device is a metal-insulator-metal capacitor. The deposition of the insulating layer and first and second conductive layers is performed without photolithography. An under bump metallization (UBM) layer is formed on the substrate in electrical contact with the plurality of active devices. A solder bump is formed over the UBM layer. The passive device can also be a resistor by depositing a resistive layer over the first conductive layer and depositing a third conductive layer over the resistive layer. The passive device electrically contacts the solder bump.

32 Claims, 8 Drawing Sheets

U.S. PATENT DOCUMENTS

| | | | |
|---|---|---|---|
| 2005/0285173 A1* | 12/2005 | Nagai et al. | 257/296 |
| 2006/0094185 A1* | 5/2006 | Jeong et al. | 438/253 |
| 2006/0205170 A1* | 9/2006 | Rinne | 438/381 |
| 2007/0059879 A1* | 3/2007 | Ting | 438/239 |
| 2007/0114634 A1 | 5/2007 | Lin et al. | |
| 2007/0148825 A1* | 6/2007 | Kikuta et al. | 438/118 |
| 2007/0205520 A1* | 9/2007 | Chou et al. | 257/780 |
| 2007/0235878 A1 | 10/2007 | Lin et al. | |
| 2008/0001254 A1* | 1/2008 | Wang | 257/532 |
| 2008/0064179 A1* | 3/2008 | Yang | 438/396 |
| 2009/0004809 A1* | 1/2009 | Chinthakindi et al. | 438/393 |
| 2010/0218978 A1* | 9/2010 | Caldwell et al. | 174/250 |

* cited by examiner

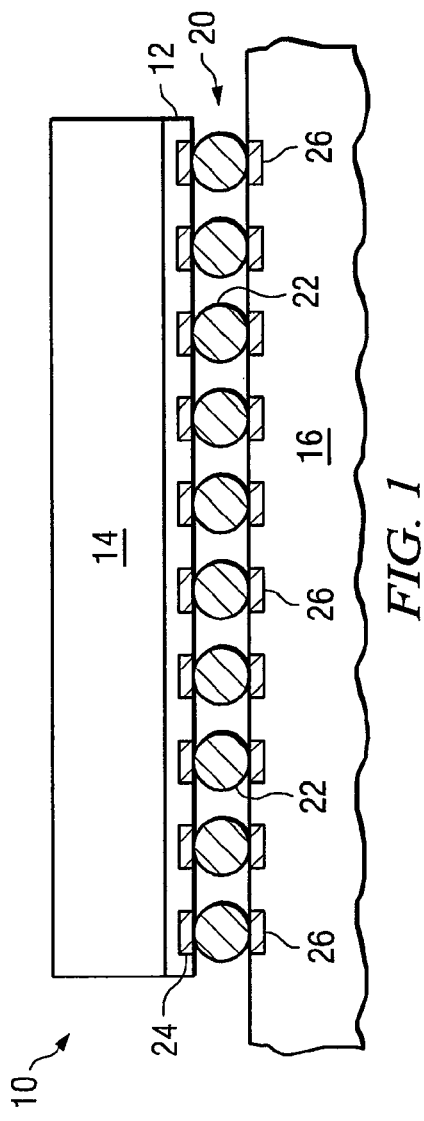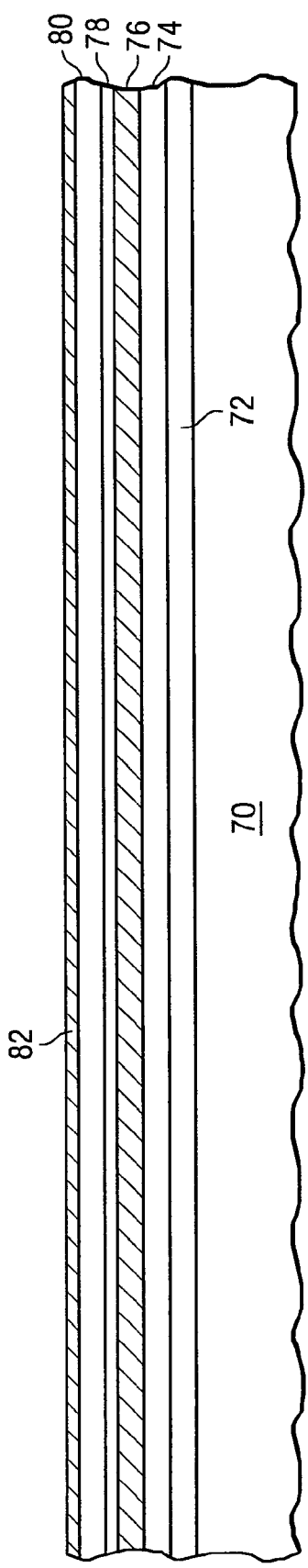
FIG. 1
FIG. 2a

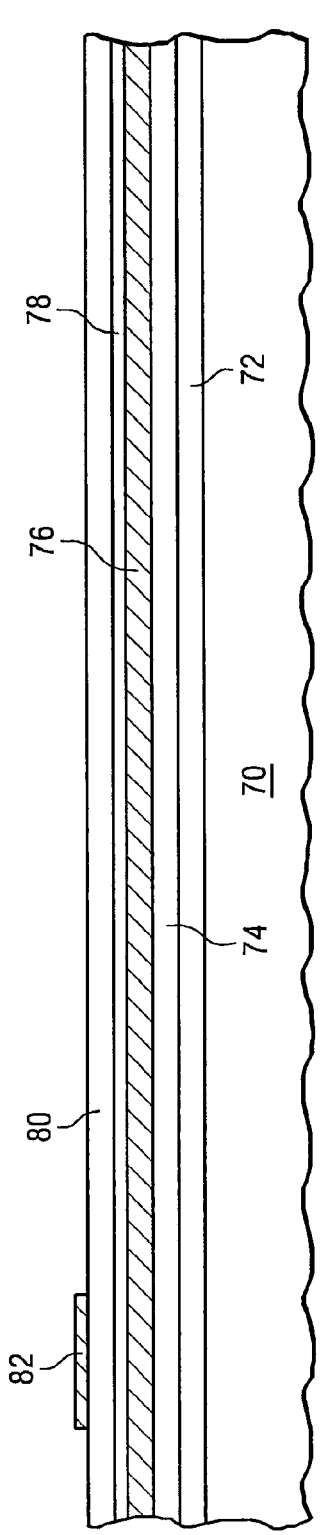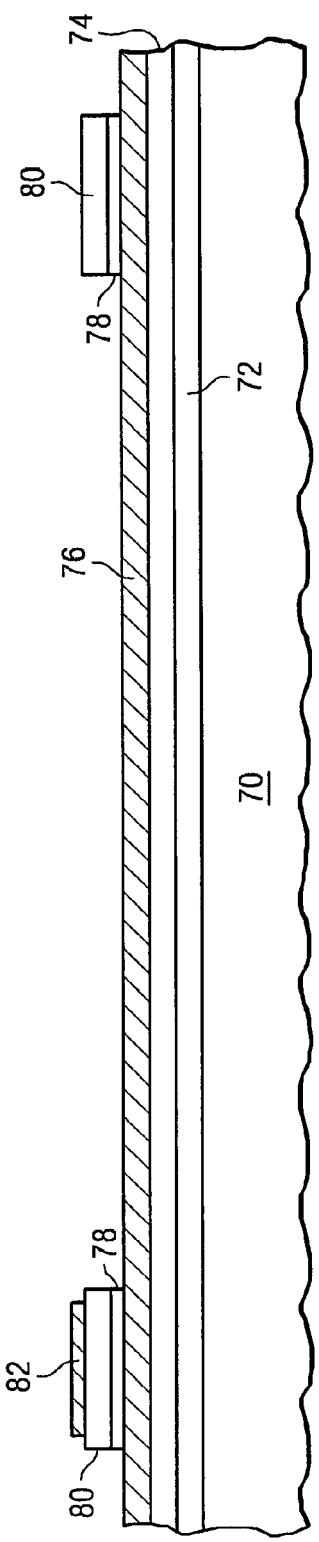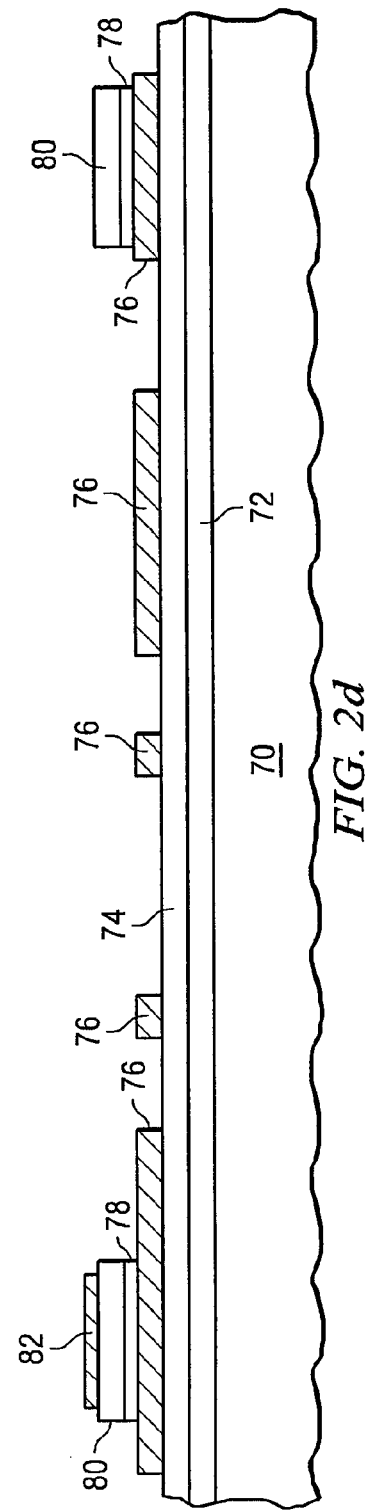

SEMICONDUCTOR DEVICE AND METHOD OF FORMING PASSIVE DEVICES

CLAIM TO DOMESTIC PRIORITY

The present non-provisional patent application claims the benefit of priority of provisional application Ser. No. 60/871,416, entitled "Structure and Method of Processing Integrated Passive Devices," filed on Dec. 21, 2006.

FIELD OF THE INVENTION

The present invention relates in general to semiconductor devices and, more particularly, to formation of an interconnect structure for integrated passive devices (IPD) on semiconductor die.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to form passive circuit elements, e.g., capacitors and resistors, on the semiconductor die. The formation of passive circuit elements often involve photolithographic processes such as masking, application of photoresist, etching, wet and dry cleaning, and wafer handling. These processes can introduce particles and other contaminants into the layers that make up the passive circuit elements. The particles and contaminants can cause defects and reduce manufacturing yield.

A need exists to form passive circuit elements on a semiconductor die without introducing particles and contaminants into the device layers.

SUMMARY OF THE INVENTION

In one embodiment, the present invention is a method of making a semiconductor device comprising the steps of providing a substrate, and forming a passive device on the substrate by (a) depositing a first conductive layer over the substrate, (b) depositing a first resistive layer over the first conductive layer, (c) depositing an insulating layer over the first resistive layer, and (d) depositing a second conductive layer over the insulating layer. The depositing steps (a)-(d) are performed without photolithography and etching. The method further includes the steps of forming an under bump metallization (UBM) layer on the substrate in electrical contact with the passive device, depositing solder material on the UBM layer, and reflowing the solder material to form a solder bump.

In another embodiment, the present invention is a method of making a semiconductor device comprising the steps of providing a substrate, and forming a passive device on the substrate by depositing a first conductive layer over the substrate, depositing an insulating layer over the first conductive layer, and depositing a second conductive layer over the insulating layer. The steps of depositing the insulating layer and first conductive layer are performed without photolithography. The method further includes the steps of forming an UBM layer on the substrate, depositing solder material on the UBM layer, and reflowing the solder material to form a solder bump. The passive device electrically contacts the solder bump.

In another embodiment, the present invention is a method of making a semiconductor device comprising the steps of providing a substrate, depositing a first conductive layer over the substrate, depositing an insulating layer over the first conductive layer, and depositing a second conductive layer over the insulating layer. The steps of depositing the insulating layer and first and second conductive layers form a passive device. The method further includes the steps of forming a UBM layer on the substrate, and forming a solder bump on the UBM layer. The passive device electrically contacts the solder bump.

BRIEF DESCRIPTION OF THE DRAWINGS

FIG. 1 is a flip chip semiconductor device with solder bumps providing electrical interconnect between an active area of the die and a chip carrier substrate;

FIGS. 2a-2i illustrate a process of forming an interconnect structure and passive circuit elements;

DETAILED DESCRIPTION OF THE DRAWINGS

Figure 2E:
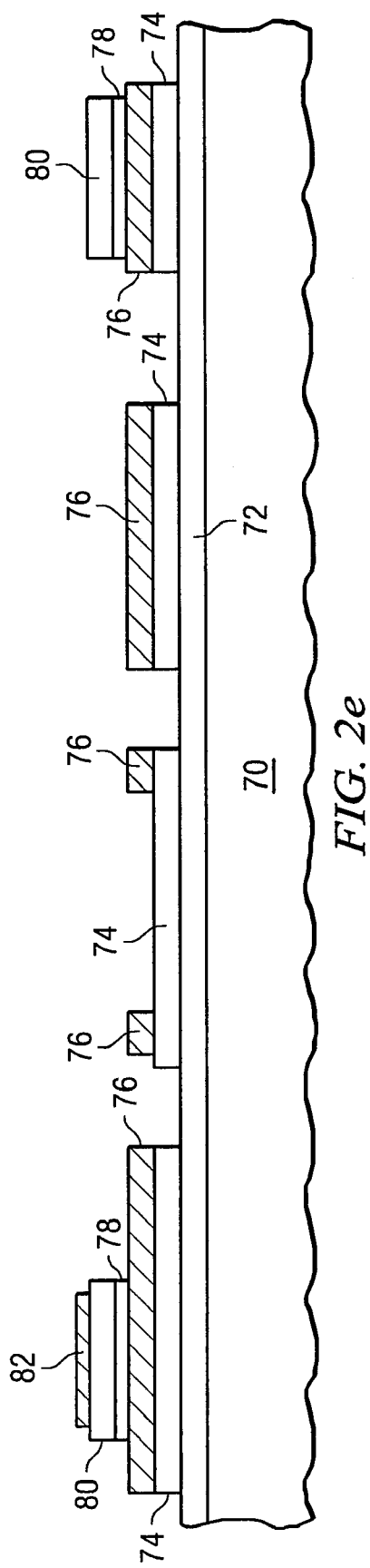

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive device formed within active area 12 and electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIG. 2a illustrates a cross-sectional view of the formation of an interconnect structure and integrated passive devices (IPD) on the substrate. A substrate 70 is provided which is made of silicon, glass, dielectric, or other bulk semiconductor material. A passivation layer 72 is deposited over substrate 70. Passivation layer 72 can be made with silicon nitride (SixNy), silicon dioxide (SiO2), silicon oxynitride (SiON), polyimide (PI), benzocyclobutene (BCB), polybenzoxazole (PBO), or other insulating material. A resistive layer 74 is deposited over passivation layer 72. Resistive layer 74 is made with a conductive material having relative high resistivity, such as tantalum (Ta) silicide, doped poly-silicon, nickel chromium (NiCr), tantalum nitride (TaN), and titanium nitride (TiN). In one example, resistive layer 74 has a surface resistivity of 5-50 ohm/square. The deposition of resistive layer 74 may involve physical vapor deposition (PVD) or physical chemical vapor deposition (CVD).

An electrically conductive layer 76 is deposited over resistive layer 74. Conductive layer 76 can be made with aluminum (Al), copper (Cu), tin (Sn), nickel (Ni), gold (Au), silver (Ag), or other electrically conductive material. Conductive layer 76 can made with single or multiple layers, for example with adhesion and barrier layers. The adhesion layer can be titanium (Ti), tantalum (Ta), and chromium (Cr). The barrier layer can be nickel vanadium (NiV), TiN, and TaN. The deposition of conductive layer 76 can use an electrolytic plating or electroless plating process, PVD, or CVD.

A second resistive layer 78, similar to resistive layer 74, is deposited over conductive layer 76. An insulating layer 80 is deposited over resistive layer 78. The insulating layer 80 is made with Si3N4, SiO2, SiON, tantalum pentoxide (Ta2O5), Zirconium (Zr) oxide, or other dielectric material. The deposition of insulating layer 80 may involve PVD or CVD with typical thickness of 50 to 4000 angstroms (Å). An optional electrically conductive layer 82 is deposited over insulating layer 80. Conductive layer 82 can be made with Al, Cu, Sn, Ni, Au, Ag, or other electrically conductive material. Conductive layer 82 can be single or multiple layers, for example with adhesion and barrier layers. The adhesion layer can be Ti, Ta, or Cr. The barrier layer can be NiV, TiN, or TaN. The deposition of conductive layer 82 uses an electrolytic plating or electroless plating process, PVD, or CVD.

The formation of layers 72-82 is achieved by patterning and/or deposition of the materials described for each layer. The patterning and deposition of layers 72-82 does not involve any photolithography processes.

In FIG. 2b, a portion of conductive layer 82 is patterned using an etching process, leaving the portion of conductive layer 82 as shown in the FIGS. Note at this point in the process the layers 72-82 which will make up and constitute analog or passive circuit elements have already been formed by patterning and deposition. Accordingly, layers 72-78 have been isolated from particles and other contaminants introduced at the interface of insulating layer 80 and conductive layer 82 in the subsequent photolithographic process.

In FIG. 2c, portions of resistive layer 78 and insulating layer 80 are patterned using an etching process, leaving the portions of resistive layer 78 and insulating layer 80 as shown in the figure. A photoresist layer is used as the mask to etch resistive layer 78 and insulating layer 80. Alternatively, conductive layer 82 can be used as the mask. The portions of resistive layer 78 and insulating layer 80 which remain are typically wider than the remaining portion of conductive layer 82.

In FIG. 2d, portions of conductive layer 76 are patterned using an etching process, leaving the portions of conductive layer 76 as shown in the figure. In FIG. 2e, portions of resistive layer 74 are patterned using an etching process, leaving the portions of resistive layer 74 as shown in the figure. The photoresist and portions of conductive layer 76 are used as the mask for the etching process.

Figure 2F:
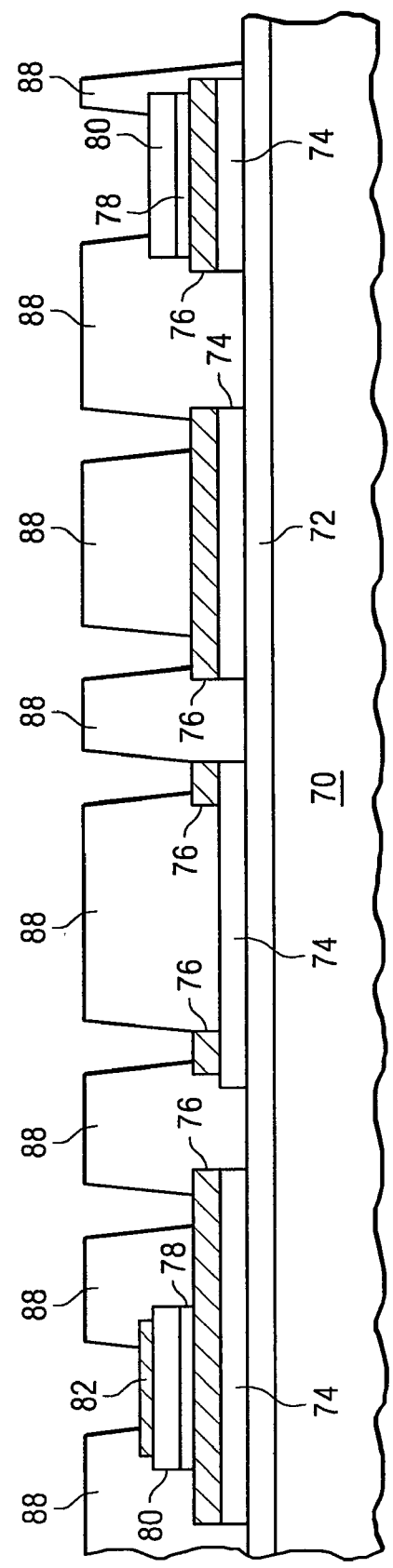

In FIG. 2f, passivation layer 88 is formed over the structure created in FIGS. 2a-2e for structural support and physical isolation. Passivation layer 88 can be made with SixNy, SiO2, SiON, PI, BCB, PBO, or other insulating material. Alternatively, passivation layer 88 can be photo-sensitive material. A portion of passivation layer 88 is removed using a wet resist developing process to expose conductive layers 76 and 82 and insulating layer 80.

Figure 2G:
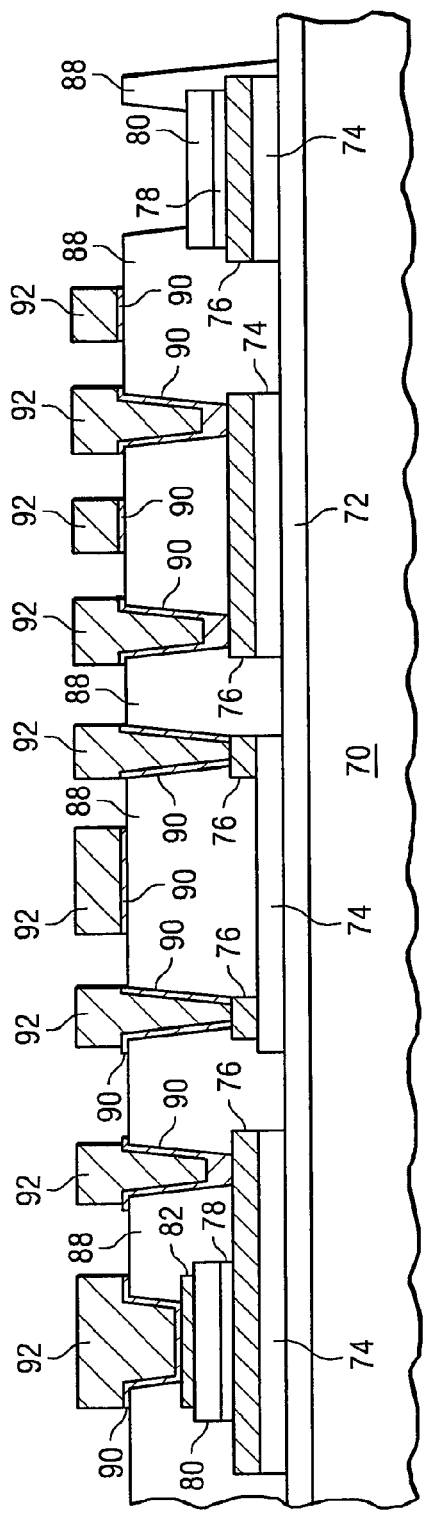

In FIG. 2g, an adhesion layer 90 and electrically conductive layer 92 are formed by patterning and deposition as shown. Adhesion layer 90 can be made with Ti, TiW, Cr, Ta, or TaN. Conductive layer 92 can be made with Al, Cu, Sn, Ni, Au, Ag, or other electrically conductive material. The deposition of conductive layers 90 and 92 uses an electrolytic plating or electroless plating process, PVD, or CVD. The conductive layer 92 can be electrically common or electrically isolated depending on the connectivity of the individual devices formed on substrate 70.

Figure 2H:
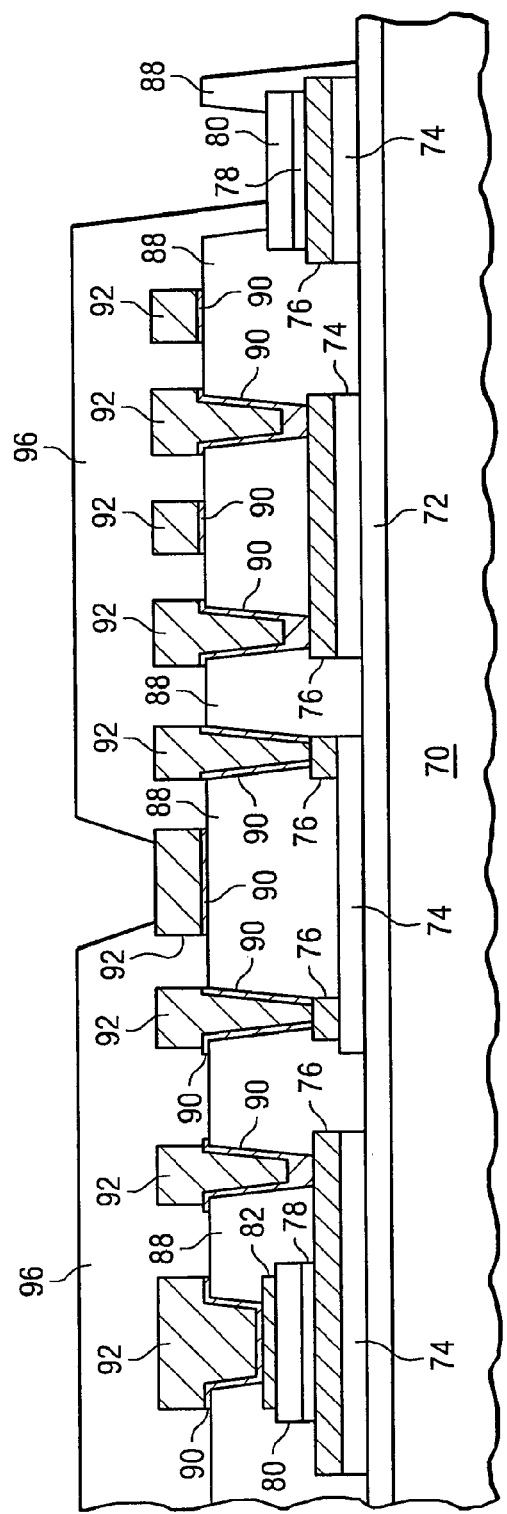

In FIG. 2h, a passivation layer 96 is formed over the structure created in FIGS. 2a-2g for structural support and physical isolation. Passivation layer 96 can be made with SixNy, SiO2, SiON, PI, BCB, PBO, or other insulating material. Alternatively, passivation layer 96 can be photo-sensitive material. A portion of passivation layer 96 is removed using a wet resist developing process to expose conductive layer 92, which is used in the formation of the solder bump, and insulating layer 80.

Figure 2I:
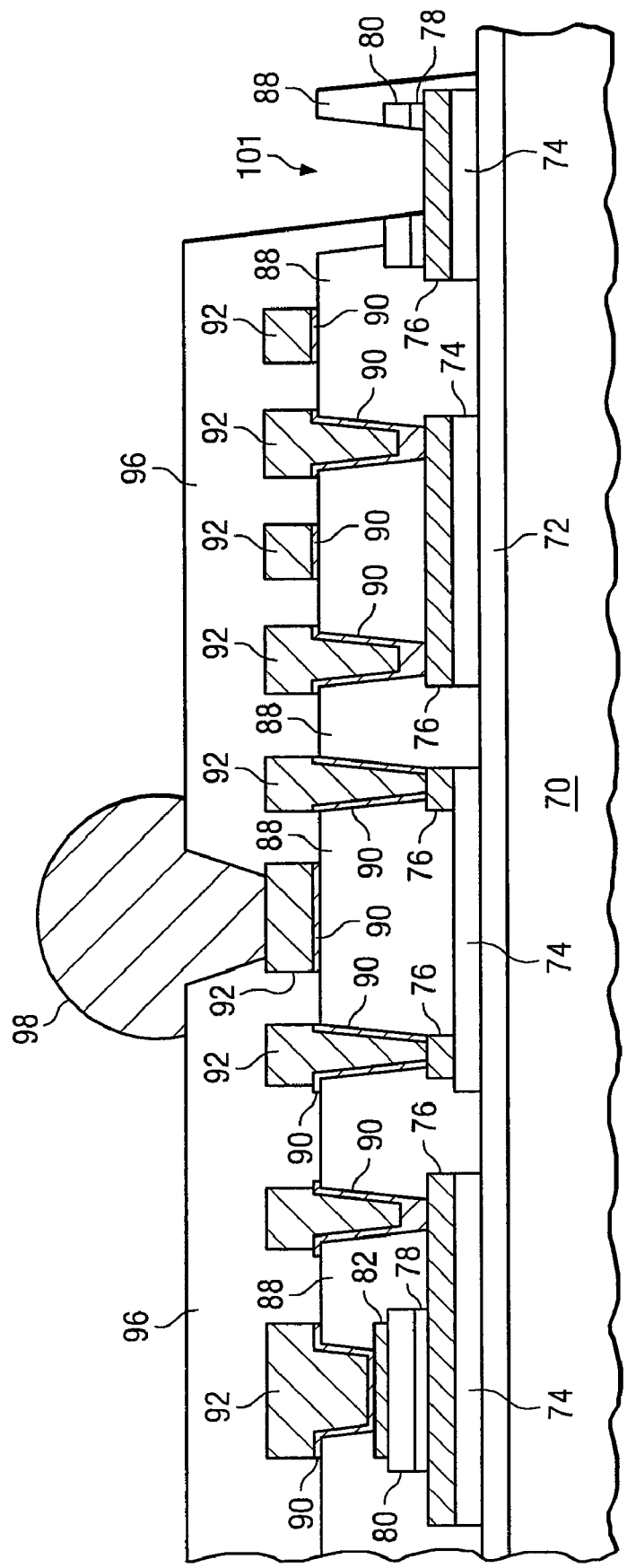

In FIG. 2i, an electrically conductive solder material is deposited over conductive layer 92 through an electrolytic plating or electroless plating process, solder paste printing process, or by pre-formed ball mounting process. Adhesive layer 90 and conductive layer 92 constitute an under bump metallization (UBM) structure. Alternatively, additional UBM layers may be applied under the solder and overlapping the UBM vias. The solder material can be any metal or electrically conductive material, e.g., Sn, Pb, Ni, Au, Ag, Cu, Bi, Sn/Ag alloy, Sn/Pb alloy. The solder material is reflowed by heating the conductive material above its melting point to form spherical ball or bump 98. In some applications, solder bump 98 is reflowed a second time to improve electrical contact to the UBM structure.

Further shown in FIG. 2i, insulating layer 80 and resistive layer 78 are exposed in openings of passivation layers 88 and 96 either after solder bumps 98 are formed or after patterning of passivation layer 96. Pad 101 is used for wire bonding.

The combination of conductive layer 76, resistive layer 78, insulating layer 80, and conductive layers 82, 90, and 92 constitute an analog or passive circuit, i.e., a metal-insulator-metal (MIM) capacitor with series resistor. The passive circuit can be electrically connected to solder bump 98 and wire bond pad 101 through conductive layers 92. Other examples of an analog or passive circuit include an inductor, capacitor, resistor, transmission line, or ground plane.

Note that the MIM capacitor and resistor are formed layer by layer as described in FIG. 2a, i.e., using patterning and deposition processes, but without using photolithographic processes. The layers constituting the passive circuit elements, including the dielectric media of the MIM capacitor, are sensitive to particles and other contaminants introduced during photolithographic processes such as etching, application of photoresist, wet and dry clean, and wafer handling. These processes are not utilized until the layers of the passive circuit elements are formed and isolated from such contaminants. The layer-by-layer continuous deposition for the passive circuit elements in FIG. 2a reduces defects in interfaces between layers, and improves manufacturing yield. The photolithographic processes in FIGS. 2b-2i occur after layer deposition for the passive circuit elements, i.e., the MIM capacitor and resistor layers.

Figure 3:
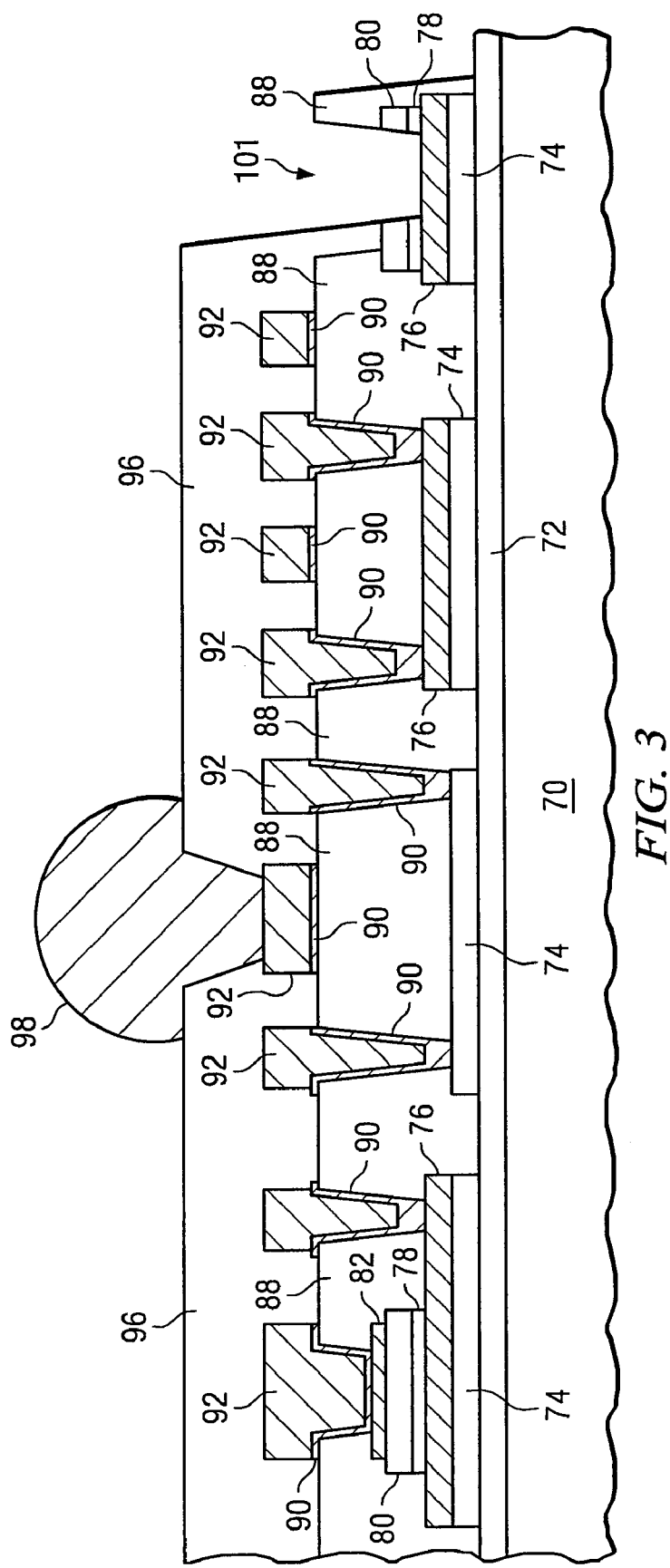
FIG. 3 illustrates an alternate embodiment of the interconnect structure and passive circuit elements.

In FIG. 3, a portion of conductive layer 76 is removed to make direct contact between adhesive layer 90 and conductive layer 92 and resistive layer 74 through vias in passivation layer 88.

Figure 4:
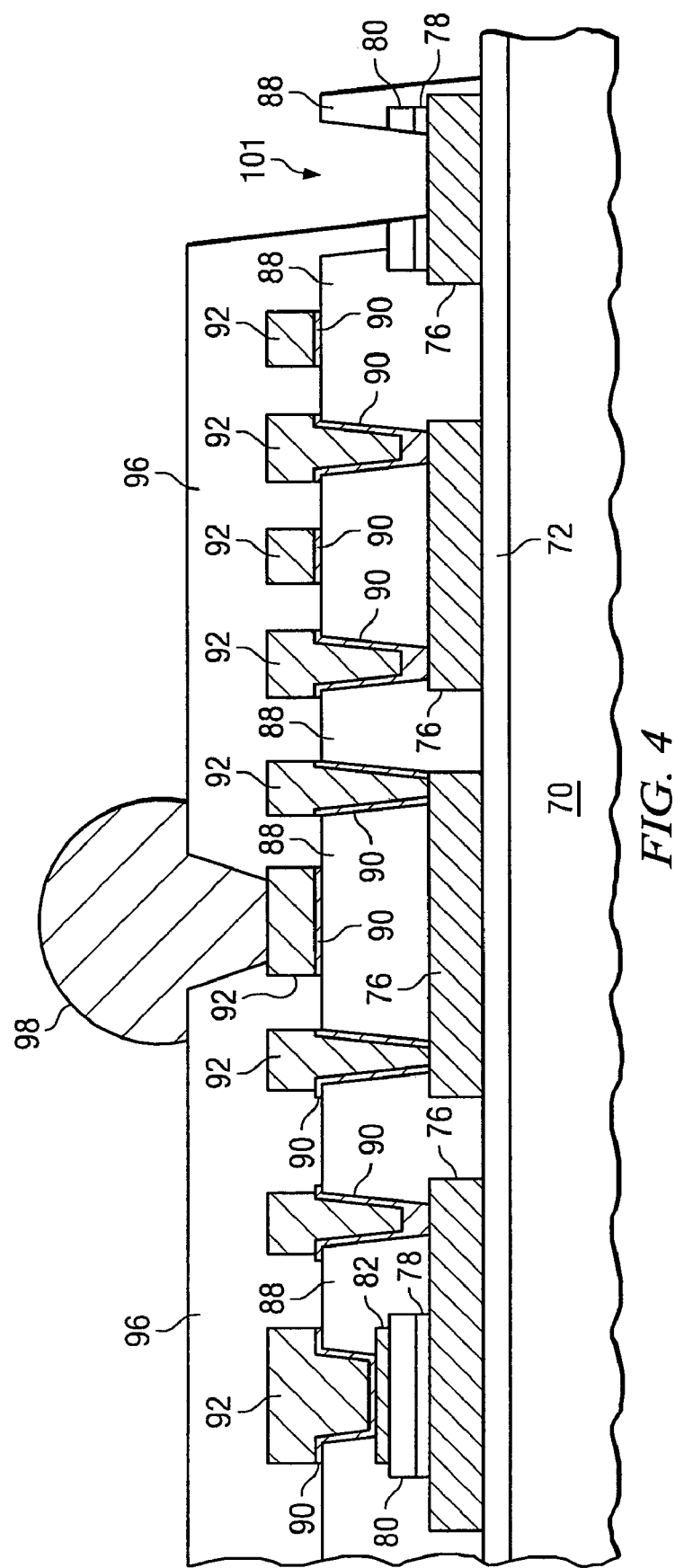
FIG. 4 illustrates another embodiment of the interconnect structure and passive circuit elements.

FIG. 4 shows an embodiment of the interconnect structure and IPDs without resistive layer 74. The embodiment in FIG. 4 has applications in balun circuits that do not require any resistor component.

Figure 5:
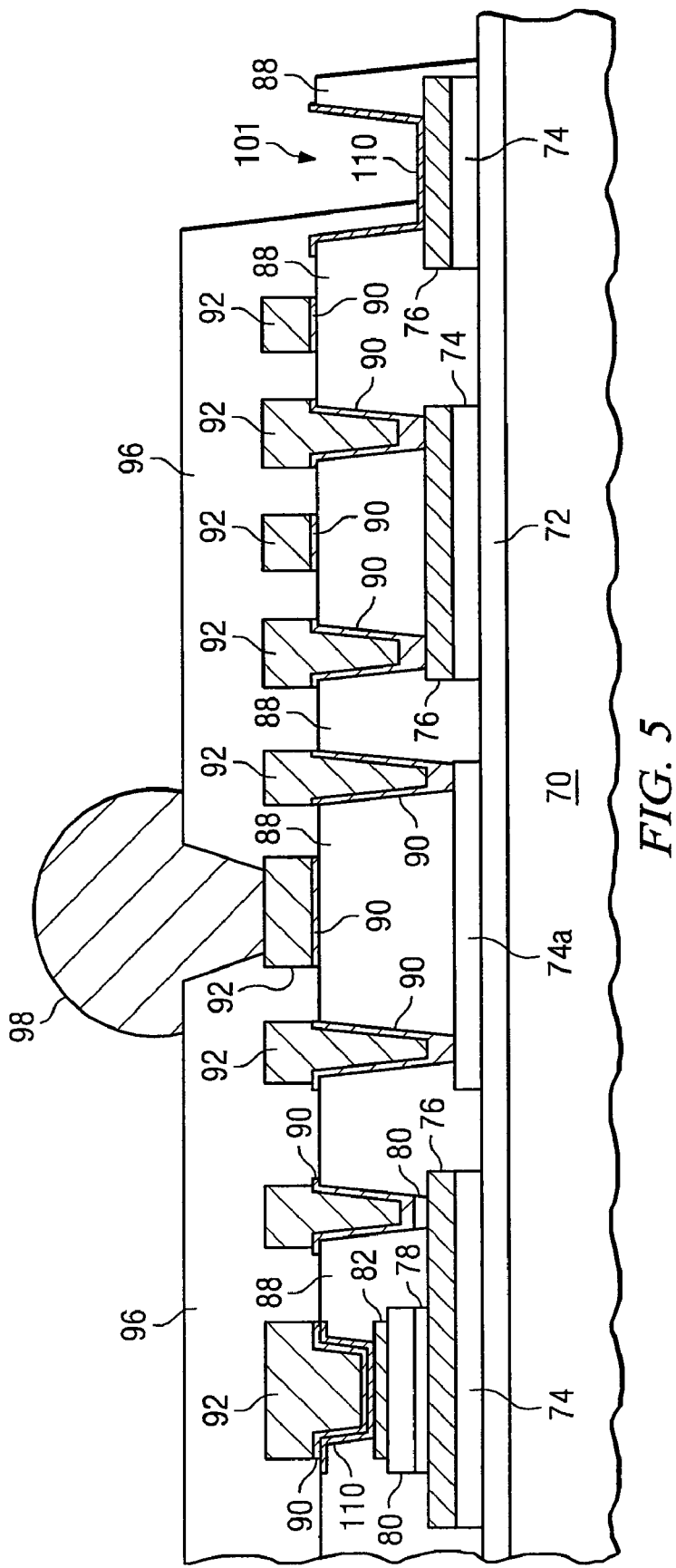
FIG. 5 illustrates another embodiment of the interconnect structure and passive circuit elements.

Another embodiment of the formation of IPD and interconnect structure is shown in FIG. 5. The substrate 70, passivation layer 72, resistive layer 74, electrically conductive layer 76, second resistive layer 78, and insulating layer 80 are formed, as described in FIG. 2. In FIG. 5, conductive layer 110 is deposited and patterned after the deposition and patterning of passivation layer 88. Conductive layer 110 also covers wire bonding pad 101. Note that there is no conductive layer 76 on resistive layer 74a which is made as a resistor component.

The combination of conductive layer 76, resistive layer 78, insulating layer 80, and conductive layers 110, 90, and 92 constitute a passive circuit, i.e., an MIM capacitor with series resistor. Note that the individual layers making the MIM capacitor and resistor are continuously deposited layer by layer over substrate, as described in FIG. 2a, without using photolithographic processes. The layers of the passive circuit elements, including the dielectric media of the MIM capacitor, are sensitive to particles introduced through masking, application of photoresist, etching, wet and dry clean, and wafer handling steps. The layer-by-layer formation of the passive circuit elements reduces defects and improves manufacturing yield. The photolithographic processes in forming the interconnect structure of FIG. 5 occur after deposition of multi-layers for formation of the passive circuit elements, i.e., the MIM capacitor and resistor layers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate; and
   forming a first passive device and a second passive device separate from the first passive device over the substrate by,
   (a) depositing a first passivation layer over a portion of the substrate encompassing the first and second passive devices, wherein the first passivation layer contacts an upper surface of the substrate,
   (b) depositing a first resistive layer over a portion of the first passivation layer encompassing the first and second passive devices, wherein the first resistive layer contacts an upper surface of the first passivation layer and the first passivation layer electrically isolates the first resistive layer from the substrate,
   (c) depositing a first conductive layer over a portion of the first resistive layer encompassing the first and second passive devices, wherein the first conductive layer contacts an upper surface of the first resistive layer, and wherein the first resistive layer comprises a first conductive material having a relatively high resistivity compared to the first conductive layer,
   (d) depositing a second resistive layer over a portion of the first conductive layer encompassing the first and second passive devices, wherein the second resistive layer contacts an upper surface of the first conductive layer, the second resistive layer comprising a second conductive material having a relatively high resistivity compared to the first conductive layer, (e) depositing an insulating layer over a portion of the second resistive layer encompassing the first and second passive devices, (f) depositing a second conductive layer over a portion of the insulating layer encompassing the first and second passive devices, and after performing the depositing steps (a)-(f), (g) etching a portion of the second conductive layer to expose the insulating layer while leaving a remaining portion of the second conductive layer, (h) etching the insulating layer and second resistive layer and halting the etching when a top surface of the first conductive layer is exposed, to leave a remaining portion of the insulating layer and second resistive layer under the remaining portion of the second conductive layer, and (i) etching the first conductive layer until a top surface of the first resistive layer is exposed, to leave a first remaining portion of the first conductive layer under the remaining portion of the insulating layer and second resistive layer and further leaving a second remaining portion of the first conductive layer over the first resistive layer, wherein the remaining portion of the second conductive layer, remaining portion of the insulating layer and second resistive layer, and first remaining portion of the first conductive layer constitute the first passive device.

2. The method of claim 1, further including forming an interconnect structure over the first and second passive device.

3. The method of claim 2, further including forming a wire bond pad over the substrate.

4. The method of claim 3, wherein the first and second passive devices are electrically connected to the interconnect structure or wire bond pad.

5. The method of claim 1, wherein forming the first passive device and the second passive device further comprises:

forming a second passivation layer over the first conductive layer and the second conductive layer;

forming a third conductive layer over the first passivation layer; and forming a third passivation layer over the third conductive layer.

6. The method of claim 1, wherein the first passive device includes a capacitor and the second passive device includes an inductor.

7. The method of claim 1, wherein each of the first and the second conductive layers consists of a single layer.

8. The method of claim 7, wherein each of the first and the second conductive layers comprises a material selected from a group consisting of copper, tin, nickel, gold, and silver.

9. The method of claim 1, wherein one of the first and the second conductive layers consists of a single layer and the other one of the first and second conductive layers comprises:

an adhesion layer, the adhesion layer comprising tantalum (Ta); and a barrier layer, the barrier layer comprising tantalum nitride (TaN).

10. The method of claim 1, wherein each of the first and the second conductive layers comprises:

an adhesion layer, the adhesion layer comprising chromium (Cr); and a barrier layer, the barrier layer comprising nickel vanadium (NiV).

11. A method of making a semiconductor device, comprising:

providing a substrate;

forming a first passive device and a second passive device separate from the first passive device over the substrate by, (a) depositing a first conductive layer over a portion of the substrate encompassing the first and second passive devices, (b) depositing a resistive layer over a portion of the first conductive layer encompassing the first and second passive devices, wherein the resistive layer contacts an upper surface of the first conductive layer, the resistive layer comprising a conductive material having a relatively high resistivity compared to the first conductive layer, (c) depositing an insulating layer over a portion of the resistive layer encompassing the first and second passive devices, (d) depositing a second conductive layer over a portion of the insulating layer encompassing the first and second passive devices, (e) etching the second conductive layer to expose the insulating layer while leaving a remaining portion of the second conductive layer, (f) etching the insulating layer and the resistive layer and halting the etching when an upper surface of the first conductive layer is exposed, to leave a remaining portion of the insulating layer under the remaining portion of the second conductive layer, and (g) etching the first conductive layer to leave a first remaining portion of the first conductive layer under the remaining portion of the insulating layer and further leaving a second remaining portion of the first conductive layer over the substrate, wherein the remaining portion of the second conductive layer, remaining portion of the insulating layer, and first remaining portion of the first conductive layer constitute the first passive device.

12. The method of claim 11, further including:

depositing the resistive layer between the first conductive layer and insulating layer;

removing a portion of the resistive layer to expose the first conductive layer; and depositing a third conductive layer over the second conductive layer.

13. The method of claim 11, wherein forming the first passive device and the second passive device further comprises:

forming a first passivation layer over the first conductive layer and the second conductive layer;

forming a third conductive layer over the first passivation layer;

forming a second passivation layer over the third conductive layer; and forming a wire bond pad over the substrate.

14. The method of claim 11, further including:

forming a third conductive layer over the second conductive layer; and forming a passivation layer over the third conductive layer.

15. A method of making a semiconductor device, comprising:

providing a substrate;

depositing a first conductive layer continuously over a portion of the substrate;

depositing a resistive layer continuously over an entire surface of the first conductive layer, the resistive layer having a relatively high resistivity compared to the first conductive layer;

depositing an insulating layer continuously over an entire surface of the resistive layer;

depositing a second conductive layer continuously over an entire surface of the insulating layer;

removing a portion of the second conductive layer to expose the insulating layer while leaving a remaining portion of the second conductive layer, removing a first portion of the insulating layer and a portion of the resistive layer and halting the removing when an upper surface of the first conductive layer is exposed, the removing of the first portion of the insulating layer leaving a first remaining portion of the insulating layer under the remaining portion of the second conductive layer and a second remaining portion of the insulating layer that is separated from the first remaining portion of the insulating layer and not under the remaining portion of the second conductive layer, and removing a portion of the first conductive layer while leaving a remaining portion of the first conductive layer under the first remaining portion of the insulating layer, wherein the remaining portion of the second conductive layer, the first remaining portion of the insulating layer, and remaining portion of the first conductive layer constitutes a passive device; and forming an interconnect structure over the passive device, wherein the passive device is electrically connected to the interconnect structure.

16. The method of claim 15, wherein the steps of depositing the insulating layer and first and second conductive layer are performed without photolithography.

17. The method of claim 15, wherein forming the interconnect structure includes:

forming a first passivation layer over the first conductive layer and the second conductive layer;

forming a third conductive layer over the first passivation layer;

forming a second passivation layer over the third conductive layer; and forming a bump over the second passivation layer electrically connected to the third conductive layer.

18. The method of claim 15, wherein the passive device includes a capacitor.

19. A method of making a semiconductor device, comprising:

providing a substrate;

forming a passive device over the substrate by, (a) depositing a first conductive layer continuously over a portion of the substrate, (b) depositing a first insulating layer continuously over an entire surface of the first conductive layer, (c) depositing a second conductive layer continuously over an entire surface of the first insulating layer, wherein the depositing steps (a)-(c) are performed without photolithography and etching, and after performing the depositing steps (a)-(c), (d) removing a portion of the second conductive layer to expose the first insulating layer while leaving a remaining portion of the second conductive layer, (e) removing a portion of the first insulating layer and halting the removing when an upper surface of the first conductive layer is exposed, to leave first and second remaining portions of the first insulating layer, the first remaining portion of the first insulating layer disposed under a remaining portion of the second conductive layer, the second remaining portion of the first insulating layer separated from the first remaining portion of the first insulating layer and not disposed under the remaining portion of the second conductive layer, and (f) removing a portion of the first conductive layer to leave a remaining portion of the first conductive layer disposed under the first remaining portion of the first insulating layer, wherein the remaining portion of the second conductive layer, the first remaining portion of the first insulating layer, and the remaining portion of the first conductive layer constitute the passive device; and forming an interconnect structure over the passive device.

20. The method of claim 19, further including:

depositing a resistive layer over the first conductive layer; and removing a portion of the resistive layer to expose the first conductive layer.

21. The method of claim 19, wherein forming the interconnect structure includes:

forming a second insulating layer over the first conductive layer and the second conductive layer;

forming a third conductive layer over the second insulating layer;

forming a third insulating layer over the third conductive layer; and forming a bump over the third insulating layer electrically connected to the third conductive layer.

22. The method of claim 19, wherein the first insulating layer includes a dielectric material.

23. The method of claim 19, further including forming a wire bond pad over the substrate.

24. The method of claim 19, wherein the passive device includes an inductor, capacitor, resistor, transmission line, or ground plane.

25. The method of claim 19, wherein a remaining portion of the first conductive layer, remaining portion of the first insulating layer, and remaining portion of the second conductive layer constitute a capacitor.

26. The method of claim 19, wherein a remaining portion of the first conductive layer constitutes an inductor.

27. A method of making a semiconductor device, comprising:

providing a substrate;

sequentially depositing a first conductive layer, a first insulating layer, and a second conductive layer over the substrate;

patterning the second conductive layer to expose the first insulating layer;

patterning the first insulating layer to leave a first remaining portion disposed under a remaining portion of the second conductive layer and a second remaining portion that is separated from the first remaining portion;

halting the patterning of the first insulating layer when the first conductive layer is exposed; and patterning the first conductive layer to leave a third remaining portion disposed under the first remaining portion, wherein a remaining portion of the second conductive layer, the first remaining portion, and the third remaining portion constitute a passive device.

28. The method of claim 27, wherein no photolithography is performed between the sequential depositing of the first conductive layer, the first insulating layer, and the second conductive layer.

29. The method of claim 27, wherein the sequential depositing further comprises, after depositing the first conductive layer and before depositing the first insulating layer, depositing a first resistive layer over the first conductive layer.

30. The method of claim 29, further comprising removing a portion of the first resistive layer to expose the first conductive layer.

31. The method of claim 27, further comprising forming an interconnect structure over the passive device.

32. The method of claim 31, wherein forming the interconnect structure includes:

forming a second insulating layer over the first conductive layer and the second conductive layer;

forming a third conductive layer over the second insulating layer;

forming a third insulating layer over the third conductive layer; and forming a bump over the third insulating layer electrically connected to the third conductive layer.

* * * * *